(12) United States Patent
Raymond (10) Patent No.: US 8,256,269 B2
(45) Date of Patent: Sep. 4, 2012

(54) AQUEOUS CHEMICAL LEAK DETECTION CABLE

(75) Inventor: Donald M. Raymond, Fort Collins, CO (US)

(73) Assignee: Raymond & Lae Engineering, Inc., Fort Collins, CO (US)

( * ) Notice: Subject to any disclaimer, the term of this patent is extended or adjusted under 35 U.S.C. 154(b) by 298 days.

(21) Appl. No.: 12/777,462

(22) Filed: May 11, 2010

(65) Prior Publication Data

US 2010/0288017 A1 Nov. 18, 2010

Related U.S. Application Data

(60) Provisional application No. 61/177,594, filed on May 12, 2009.

(51) Int. Cl.
*G01M 3/04* (2006.01)
(52) U.S. Cl. .......................................................... 73/40
(58) Field of Classification Search ........................ 73/40
See application file for complete search history.

(56) References Cited

U.S. PATENT DOCUMENTS

| | | |
|---|---|---|
| 3,662,367 A | 5/1972 | DeVeau et al. |
| 3,759,552 A | 9/1973 | Levinsohn et al. |
| 3,981,181 A | 9/1976 | Ochiai |
| 4,029,889 A | 6/1977 | Mizuochi |
| 4,206,402 A | 6/1980 | Ishido |
| 4,373,768 A | 2/1983 | Clarke |
| 4,386,231 A | 5/1983 | Vokey |
| 4,417,782 A | 11/1983 | Clarke et al. |
| 4,436,566 A | 3/1984 | Tight |
| 4,468,536 A | 8/1984 | Van Noten |
| 4,505,542 A | 3/1985 | Clarke |
| 4,570,477 A | 2/1986 | Sugibuchi |
| 4,594,638 A | 6/1986 | Suzuki et al. |
| 4,614,557 A | 9/1986 | Willie et al. |
| 4,767,652 A | 8/1988 | Willie et al. |
| 4,797,621 A | 1/1989 | Anderson et al. |
| 4,843,327 A | 6/1989 | Koppitsch et al. |
| 4,862,146 A | 8/1989 | McCoy et al. |
| 4,862,148 A | 8/1989 | Kichline |
| 4,877,923 A | 10/1989 | Sahakian |
| 4,910,998 A | 3/1990 | Willis et al. |
| 4,922,183 A | 5/1990 | Kamas |
| 4,926,129 A | 5/1990 | Wasley et al. |
| 4,931,741 A | 6/1990 | Koppitsch et al. |

(Continued)

FOREIGN PATENT DOCUMENTS

EP 0160441 11/1985

(Continued)

OTHER PUBLICATIONS

Website: www.darwell.com.

(Continued)

*Primary Examiner* — Hezron E Williams
*Assistant Examiner* — Jamar Ray
(74) *Attorney, Agent, or Firm* — William W. Cochran; Cochran, Freund & Young LLC (57) ABSTRACT

Disclosed are aqueous chemical leak detection cables that provide protection to sensor wires by using a conductive polymer coating that is resistant to corrosion by aqueous chemicals. In addition, non-conductive, liquid pervious layers may surround one or more of the sensor wires to assist in preventing false detection of a aqueous chemical leak as a result of various non-liquid contaminants. The non-conductive, liquid pervious layer may comprise braided, non-hydroscopic, non-conductive fibers, or a continuous, non-conductive pervious coating.

13 Claims, 8 Drawing Sheets

U.S. PATENT DOCUMENTS

| | | |
|---|---|---|
| 4,949,076 A | 8/1990 | Wann |
| 4,970,466 A | 11/1990 | Bolles et al. |
| 5,015,958 A | 5/1991 | Masia et al. |
| 5,101,657 A | 4/1992 | Lahlouh et al. |
| 5,134,377 A | 7/1992 | Reddy, III. et al. |
| 5,136,249 A | 8/1992 | White et al. |
| 5,144,250 A | 9/1992 | Little |
| 5,159,276 A | 10/1992 | Reddy, III |
| 5,172,730 A | 12/1992 | Driver |
| 5,177,996 A | 1/1993 | Sahakian |
| 5,203,202 A | 4/1993 | Spencer |
| 5,235,286 A | 8/1993 | Masia et al. |
| 5,334,970 A | 8/1994 | Bailey |
| 5,342,218 A | 8/1994 | McMills et al. |
| 5,355,720 A | 10/1994 | Bailey |
| 5,381,097 A | 1/1995 | Takatori et al. |
| 5,382,909 A | 1/1995 | Masia et al. |
| 5,402,828 A | 4/1995 | Pino |
| 5,410,255 A | 4/1995 | Bailey |
| 5,918,267 A | 6/1999 | Evans et al. |
| 6,144,209 A | 11/2000 | Raymond et al. |
| 6,175,310 B1 | 1/2001 | Gott |
| 6,526,807 B1 | 3/2003 | Doumit et al. |
| 6,734,364 B2 | 5/2004 | Price et al. |
| 6,777,947 B2 | 8/2004 | McCoy et al. |
| 7,081,759 B2 | 7/2006 | Raymond et al. |
| 7,212,009 B2 | 5/2007 | Raymond et |
| 2002/0071113 A1 | 6/2002 | Moran et al. |
| 2005/0115664 A1 | 6/2005 | Musahl et al. |
| 2009/0301172 A1 | 12/2009 | Raymond |

FOREIGN PATENT DOCUMENTS

| | | |
|---|---|---|
| EP | 0164838 | 12/1985 |
| EP | 0354733 | 9/1989 |
| FR | 2709347 | 8/1993 |
| WO | 9114306 | 9/1991 |

OTHER PUBLICATIONS

Website: www.permapipe.com.

Non-Final Office Action mailed Sep. 1, 2005, in U.S. Appl. No. 11/000,636, filed Nov. 30, 2004.

Final Office Action mailed Jan. 19, 2006, in U.S. Appl. No. 11/000,636, filed Nov. 30, 2004.

Non-Final Office Action mailed Jun. 15, 2006, in U.S. Appl. No. 11/278,076, filed Mar. 30, 2006.

Final Office Action mailed Oct. 25, 2006, in U.S. Appl. No. 11/278,076, filed Mar. 30, 2006.

AQUEOUS CHEMICAL LEAK DETECTION CABLE

CROSS-REFERENCED TO RELATED APPLICATIONS

The present application is based upon and claims the benefit of U.S. Provisional Patent Application No. 61/177,594, entitled "AQUEOUS CHEMICAL LEAK DETECTION CABLE", and filed May 12, 2009, by Donald M. Raymond. The entire content of the above-mentioned application and the U.S. patent application Ser. No. 12/464,787, filed May 12, 2009, by Donald M. Raymond, entitled "Twisted Leak Detection Cable" are hereby specifically incorporated herein by reference for all they disclose and teach.

BACKGROUND OF THE INVENTION

Aqueous chemical fluid leaks can occur in commercial, industrial and residential environments. Aqueous chemical fluid leaks can cause serious damage to various types of components, especially components that are sensitive to aqueous chemical fluids. For example, certain types of aqueous chemicals are capable of dissolving insulation on wires. Other types of aqueous chemical fluids may have a corrosive effect on other materials, such as metal. Hence, early detection of aqueous chemical leaks can be very beneficial.

The process of detecting aqueous chemical leaks can employ the use of a detection cable that is connected to a monitor that provides an alarm upon detection of a leak. The alarm can be an auditory alarm and/or can communicate the alarm information through various communication devices. Monitors are disclosed in U.S. Pat. Nos. 7,212,009 and 6,144,209, and in the U.S. non-provisional application filed May 12, 2009, by Donald M. Raymond, entitled "Twisted Leak Detection Cable" Ser. No. 12/464787, which are specifically incorporated herein by reference for all they disclose and teach.

SUMMARY OF THE INVENTION

An embodiment of the present invention may therefore comprise a method of sensing aqueous chemicals using a aqueous chemical leak detection cable comprising: providing a base member that is made from non-conductive polymer that is resistant to corrosion by the aqueous chemicals, the base member formed from two insulated lobes that are joined together to form two interstices on opposite sides of the insulated conductors; providing at least one conductor wire in at least one lobe of the base member; providing sensor cables that have a conductive polymer coating that is resistant to corrosion by the aqueous chemicals; providing a sensor wire in each of the sensor cables that is protected from the aqueous chemicals by the conductive polymer coating that is resistant to corrosion by the aqueous chemicals; placing the sensor cables in each of the interstices; twisting the base member so that the sensor cables are exposed to the surface along a length of the aqueous chemical leak detection cable; detecting the presence of the aqueous chemicals on the surface whenever the aqueous chemicals create a conductive path between the sensor cables such that the conductive polymer coating creates the conductive path to the sensor wires from the aqueous chemicals and simultaneously protects the sensor wires from corrosion.

An embodiment of the present invention may further comprise a aqueous chemical leak detection cable for detecting the presence of aqueous chemicals comprising: a base member that is made from non-conductive polymer that is resistant to corrosion by the aqueous chemicals, the base member comprising two lobes that are connected along a longitudinal surface to form two interstices on opposite sides of the base member; at least one conductive wire disposed in at least one of the lobes of the base member; two sensor cables that are disposed in the two interstices, the sensor cables having sensor wires and a conductive polymer coating that is resistant to corrosion by the aqueous chemicals and that surrounds the sensor wires to protect the sensor wires from corrosion by the aqueous chemicals, the two sensor cables and the base member being twisted together to form a helix so that the sensor cables are exposed to in different directions along the length of the aqueous chemical leak detection cable.

DETAILED DESCRIPTION OF THE INVENTION

Figure 1:
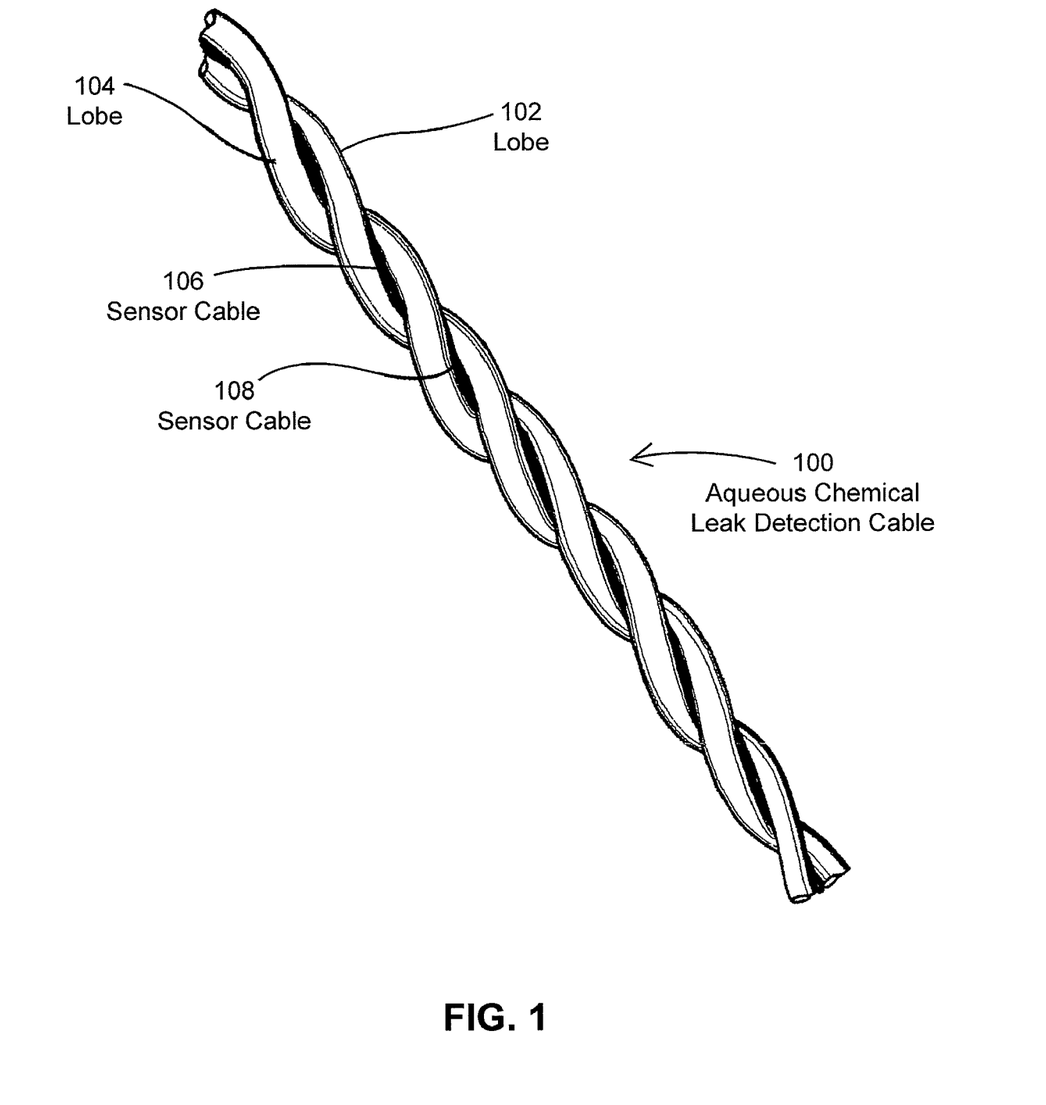
FIG. 1 is a perspective view of one embodiment of an aqueous chemical leak detection cable.

FIG. 1 is a perspective view of one embodiment of a aqueous chemical leak detection cable 100. As illustrated in FIG. 1, the aqueous chemical leak detector cable 100 includes a first lobe 102 and a second lobe 104 that are coupled together and twisted in a spiral or helix configuration. Disposed in the two interstitial spaces between the lobes 102, 104 are two sensor cables 106, 108. In this fashion, when the aqueous chemical leak detector cable 100 is placed in an area to detect a aqueous chemical leak, the two sensor cables 106, 108 are on opposite sides of the detector cable 100 to prevent the detector cable 100 from being shorted out, or otherwise generating a false positive detection of a leak, if a conductive surface comes into contact with the detector cable 100.

Figure 2:
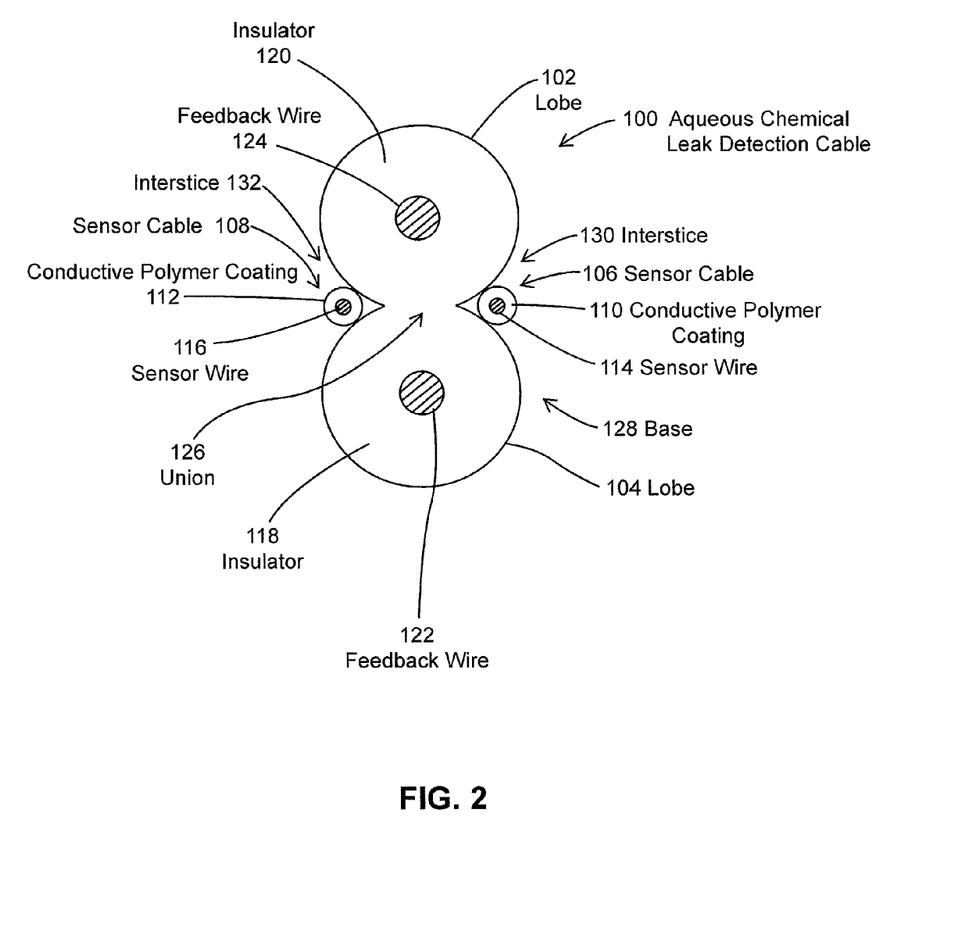
FIG. 2 is an end view of the aqueous chemical leak detection cable of FIG. 1.

FIG. 2 is an end view of the detector cable 100 illustrated in FIG. 1. As shown in FIG. 2, lobe 102 is coupled or joined to lobe 104, while sensor cable 106 and sensor cable 108 are disposed in the interstices 130, 132 between the union 126 of the lobes 102, 104. The union 126 is the region in which the lobes 102, 104 are joined together. One typical method of manufacturing the detector cable 100 includes the use of a cross die to extrude the base 128, together with the conductive feedback wires 122, 124, in a cross die polymer extrusion process, such as those that are typically used for forming insulated wires. The cross die may have a shape that matches the shape of the base 128. Alternatively, the lobes 102, 104 can be separately formed and twisted together and heated, or held together or twisted together during the extrusion process, to create the base 128 having a union 126 that joins the lobes 102, 104. Of course, other alternative processes can be used for creating the base 128, as are well-known in the art. The juxtaposition and joining of the lobes 102, 104 creates interstices 130, 132 adjacent and proximate to union 126.

As also disclosed in FIG. 2, situated within interstices 130, 132 are sensor cables 106, 108. Also, the sensor cables 106, 108 can be first placed in the interstices 130, 132, respectively, and the entire assembly can then be twisted into a helix. The twisting assists in holding the sensor cables 106, 108 in the interstices 130, 132. Sensor cables 106, 108 have a conductive polymer coating 110, 112 that surrounds and protects sensor wires 114, 116. The conductive polymer coating 110, 112 is resistant to corrosion by various aqueous chemicals that the detector cable 100 is designed to detect, as well as other aqueous chemicals that may affect the detector cable 100. Since the detector cable 100 is twisted in a helix configuration, each of the sensor cables 106, 108 are periodically exposed to a surface along the length of the detector cable 100, so that aqueous chemicals that are disposed on the surface provide a conductive path between sensor cables 106, 108. Sensor cables 106, 108 include sensor wires 114, 116 that are in conductive contact with conductive polymer coatings 110, 112, respectively. Sensor wires 114, 116 can be resistive wires that indicate the location of the detection of the aqueous chemical leak by measuring the total resistance in the monitor. Alternatively, other techniques can be used, such as time domain reflectometry to measure the location of the leak, as disclosed in U.S. Pat. No. 6,144,209, which has been incorporated herein by reference for all that it discloses and teaches. The layout of the lobes 102, 104 and the sensor cables 106, 108 that are disposed in interstices 130, 132 have a geometry that prevents most false detections of aqueous chemical liquids. For example, existing sensor cables do not use larger lobes that provide the large interstices 130, 132. The large interstices 130, 132 result in the sensor cables 106, 108 being recessed, which further assists in protecting the sensor cables 106, 108 from false detections. In existing cables, the sensor wires are located much closer to each other and high humidity, contamination or a heavy metal object that compresses the detection cable can cause false detections. In addition, the insulator 120 may be made from a material that has affinity to the conductive polymer coatings 110, 112. This further assists in holding the sensor cables 106, 108 in the interstices 130, 132, respectively. Materials that have affinity are specifically set forth in the U.S. patent application Ser. No. 12/464,787, filed May 12, 2009, by Donald M. Raymond, entitled "Twisted Leak Detection Cable" which is specifically incorporated herein by reference for all that it discloses and teaches.

Figure 3:
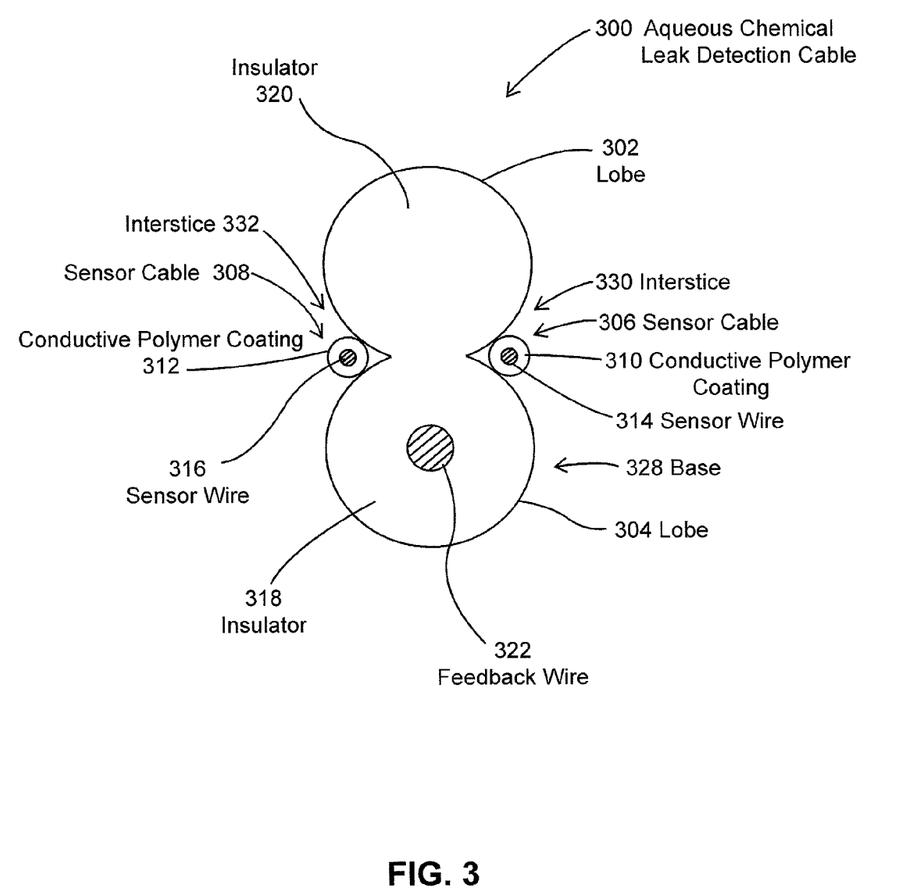
FIG. 3 is an end view of another embodiment of an aqueous chemical leak detection cable.

FIG. 3 is a schematic end view of another embodiment of a aqueous chemical leak detection cable 300. As shown in FIG. 3, the aqueous chemical leak detection cable 300 includes lobes 302, 304 that are joined together in the same manner as described above. Lobes 302, 304 form interstices 330, 332. Sensor cables 306, 308 are placed in interstices 330, 332, respectively. Sensor cable 306 includes a sensor wire 314 that is surrounded by a conductive polymer coating. Similarly, sensor cable 308 has a sensor wire 316 that is covered by a conductive polymer coating 312. The conductive polymer coatings 310, 312, as well as the insulators 318, 320 of base 328, are made from a polymer material that is resistant to corrosion by various aqueous chemicals to which these polymers may be contacted. For example, these polymer materials may comprise PVC, polyolefin, PVDF, TPE, TPR, CPE, polyester elastomer, PVDF, nylon, PET, polyurethane or fluoropolymer, which have carbon particles dispersed throughout to provide conductivity. The aqueous chemical leak detection cable 300, that is illustrated in FIG. 3, is also twisted in a helix or spiral. As such, sensor cables 306, 308 are periodically exposed to a surface along the length of the detector cable, so that aqueous chemicals that are disposed on the surface can provide a conductive path between the sensor cables 306, 308. Additionally, as shown in FIG. 3, lobe 304 contains a single feedback wire 322 for communicating information to a monitor that detects and locates the position of a aqueous chemical leak along the length of the aqueous chemical leak detection cable 300. Since it is possible to perform monitoring with a single feedback cable, a similar feedback wire is not included in the embodiment of FIG. 3 in lobe 302.

Figure 4:
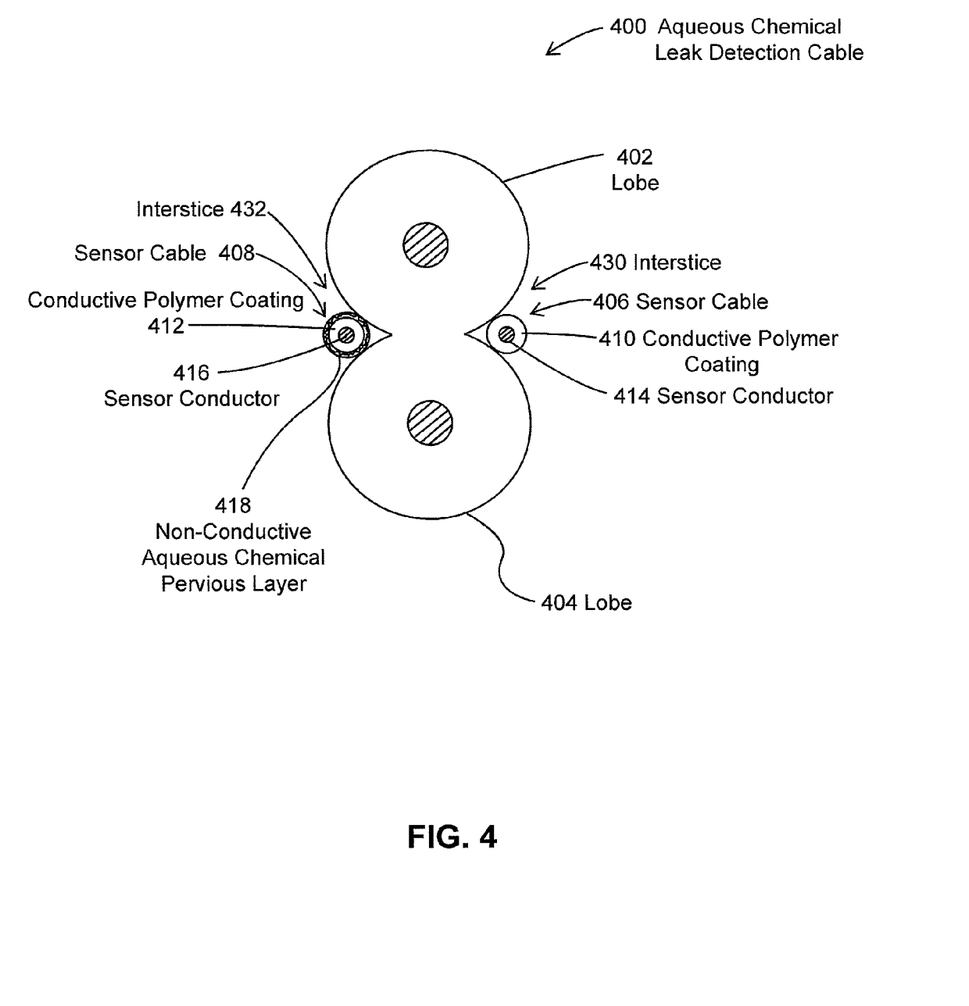
FIG. 4 is an end view of another embodiment of an aqueous chemical leak detection cable.

FIG. 4 is a schematic end view of another embodiment of a aqueous chemical leak detection cable 400. As shown in FIG. 4, the aqueous chemical leak detection cable 400 includes a lobe 402 and a lobe 404. Lobe 402 and lobe 404 are joined together so that interstices 430 and interstices 432 are formed between lobes 402, 404. Sensor cables 406, 408 are disposed in interstices 430, 432, respectively. Sensor cable 406 includes a sensor conductor 414 that is covered by a conductive polymer coating 410. Sensor cable 408 includes a sensor conductor 416 that is covered by a conductive polymer coating 412. The conductive polymer coatings 410, 412, as well as the material that is used for the lobes 402, 404 is resistant to corrosion by aqueous chemicals. Sensor cable 408 also includes a non-conductive, aqueous chemical pervious layer 418 that surrounds the conductive polymer coating 412. The non-conductive, aqueous chemical pervious layer 418 can comprise braided or woven strands of Nomex, a registered trademark of Dupont, which comprises aromatic nylon, the meta-variant of the para-aramid Kevlar. For example, poly-meta-phenylene isophthalamide strands or fibers may be used. Kevlar can also be used for the braided strands. Kevlar is also a registered trademark of Dupont Corporation. Kevlar is considered to be a strong, para-aramid synthetic fiber that is related to other aramids, such as Nomex and Technora, which is also a registered trademark of Dupont Corporation.

The non-conductive, aqueous chemical pervious layer 418, that is illustrated in FIG. 4, can alternatively comprise a non-braided, non-conductive, continuous polymer coating that is porous to aqueous chemicals. Porous polymer coverings for conductors can be obtained from Northwire, Inc., Osceola, Wis., and Putnam Plastics, Dayville, Conn. This continuous, non-braided, non-conductive polymer coating provides a fluid transmission path for aqueous chemicals that permits the fluid aqueous chemicals to pass through the continuous, non-braided, non-conductive polymer coating and make electrical contact or ionic contact with the conductive polymer coating 412. Conductive polymer coating 412 is not porous and protects the sensor conductor 416 from the aqueous chemicals, while still allowing a conduction path to be created between the aqueous chemicals and the sensor conductor 416. At the same time, the continuous, non-braided, non-conductive polymer coating provides an insulation layer that electrically insulates the conductive polymer coating 412 from non-liquid materials which may include contaminants, metal surfaces or materials, that could provide a conductive path between the conductive polymer coating 410 and the conductive polymer coating 412. For example, airborne ionic particulates may accumulate on surfaces such as the surface of the aqueous chemical leak detection cable 400, especially in high humidity environments. Other types of solid contaminants could also provide an electrical path between the conductive polymer coating 410 and the conductive polymer coating 412, if the conductive polymer coating 412 is not protected by a non-conductive, liquid pervious layer, such as described above. Pores that are disposed in the non-conductive, continuous, non-braided polymer coating are disposed throughout the coating layer, which allows the aqueous chemical liquids to penetrate to contact the conductive polymer coating 412. The non-conductive, aqueous chemical pervious layer 418 is a non-conductive, porous, non-braided, continuous covering and is pervious to aqueous chemicals, which provides a conduction path between conductive polymer coating 410 and conductive polymer coating 412. These pores do not comprise spaces, such as the spaces between braided or woven fibers, but are disposed in a continuous covering that is porous to aqueous chemicals. In this manner, the pores of the non-conductive, aqueous chemical pervious layer 418 are different from the spaces that exist between braided strands. The pores in the non-conductive, aqueous chemical pervious layer 418 may be sufficiently small to be impervious to metal particles and other contaminants.

Figure 5:
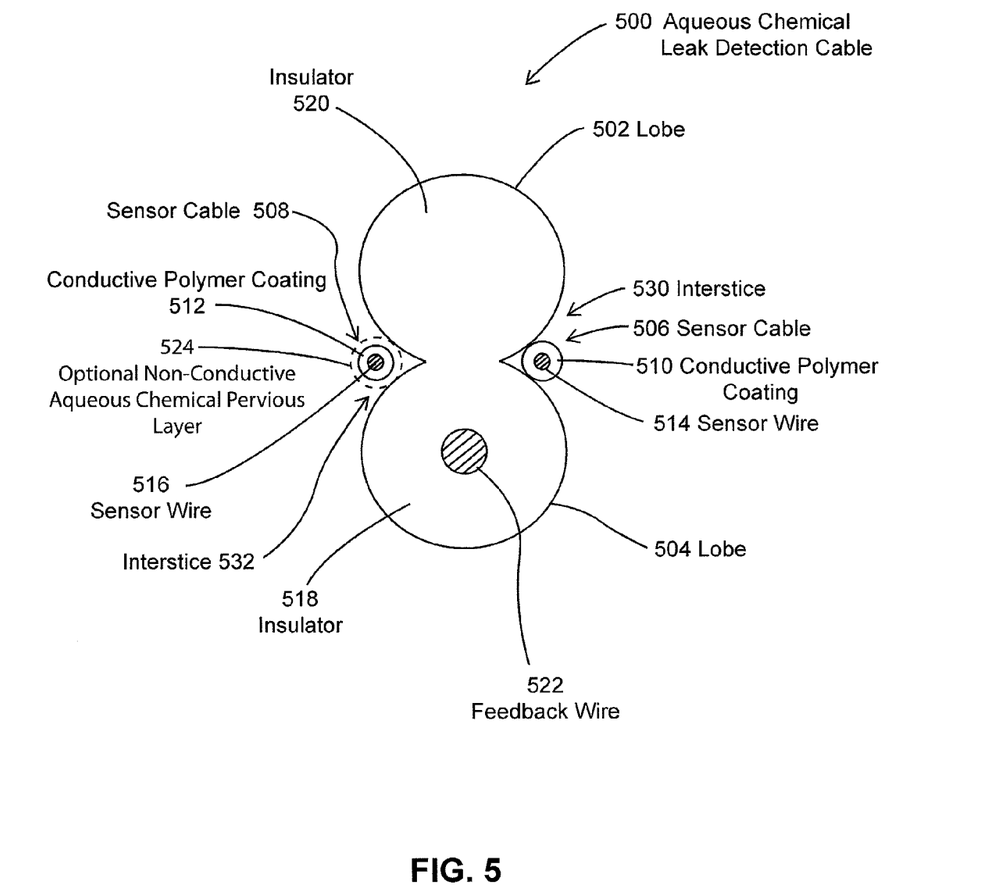
FIG. 5 is an end view of another embodiment of an aqueous chemical leak detection cable.

FIG. 5 is an end view of another embodiment of an aqueous chemical leak detection cable 500. As shown in FIG. 5, the aqueous chemical leak detection cable includes lobes 502, 504, as well as sensor cables 506, 508 that are disposed in interstices 530, 532, respectively, that are formed between lobes 502, 504. Sensor cable 506 includes a conductive polymer coating 510, which surrounds the sensor wire 514. Sensor cable 508 includes, or may not include, an optional non-conductive, aqueous chemical pervious layer 524 that surrounds a conductive polymer coating 512, which, in turn, surrounds sensor wire 516. Lobe 502 is constructed from an insulator 520, while lobe 504 is constructed of an insulator 518. A single feedback wire 522 is disposed in lobe 504.

Figure 6:
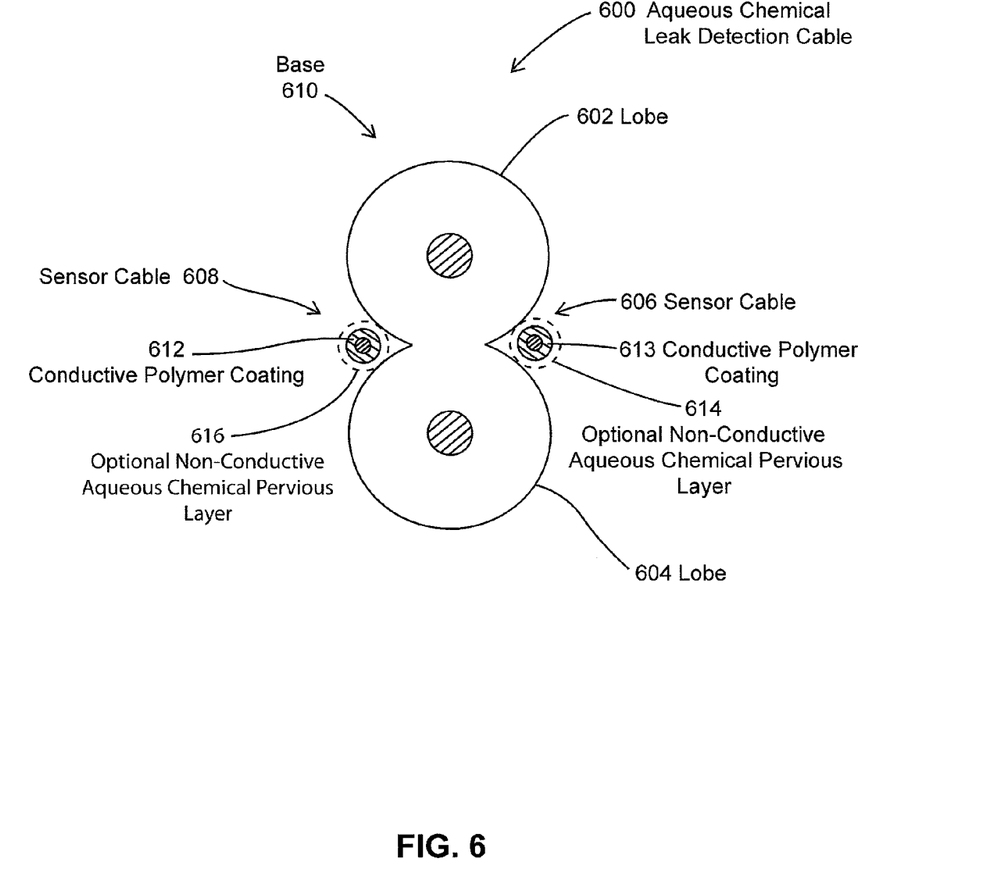
FIG. 6 is an end view of another embodiment of an aqueous chemical leak detection cable.

FIG. 6 is a schematic end view of a aqueous chemical leak detection cable 600. As shown in FIG. 6, the aqueous chemical leak detection cable 600 includes a lobe 602 and a lobe 604 that comprise a base 610. In addition, the aqueous chemical leak detection cable 600 includes sensor cables 606, 608. The sensor cables 606, 608 include a conductive polymer coating 612, 613 that surround sensor wires. The conductive polymer coatings 612, 613 are surrounded by an optional non-conductive, aqueous chemical pervious layer 614. Again, the optional, non-conductive, aqueous chemical pervious layer 614 may comprise braided, non-conductive, non-hydroscopic fibers that surround and insulate the conductive polymer coating 612, 613. Alternatively, the optional, non-conductive, aqueous chemical pervious layer 614, 616 may comprise a continuous, non-braided, non-conductive coating that is porous to aqueous chemicals and that surrounds the conductive polymer coating 612, 613. FIG. 6 illustrates that both, either and/or neither sensor cables 606, 608 are surrounded by the optional, non-conductive, aqueous chemical pervious layers 614, 616, which further assist in preventing conduction between the sensor cables 606 and 608, as a result of non-liquid residues, ionic conduction paths created by solid contaminants, and other contamination that does not comprise a liquid aqueous chemical.

Figure 7:
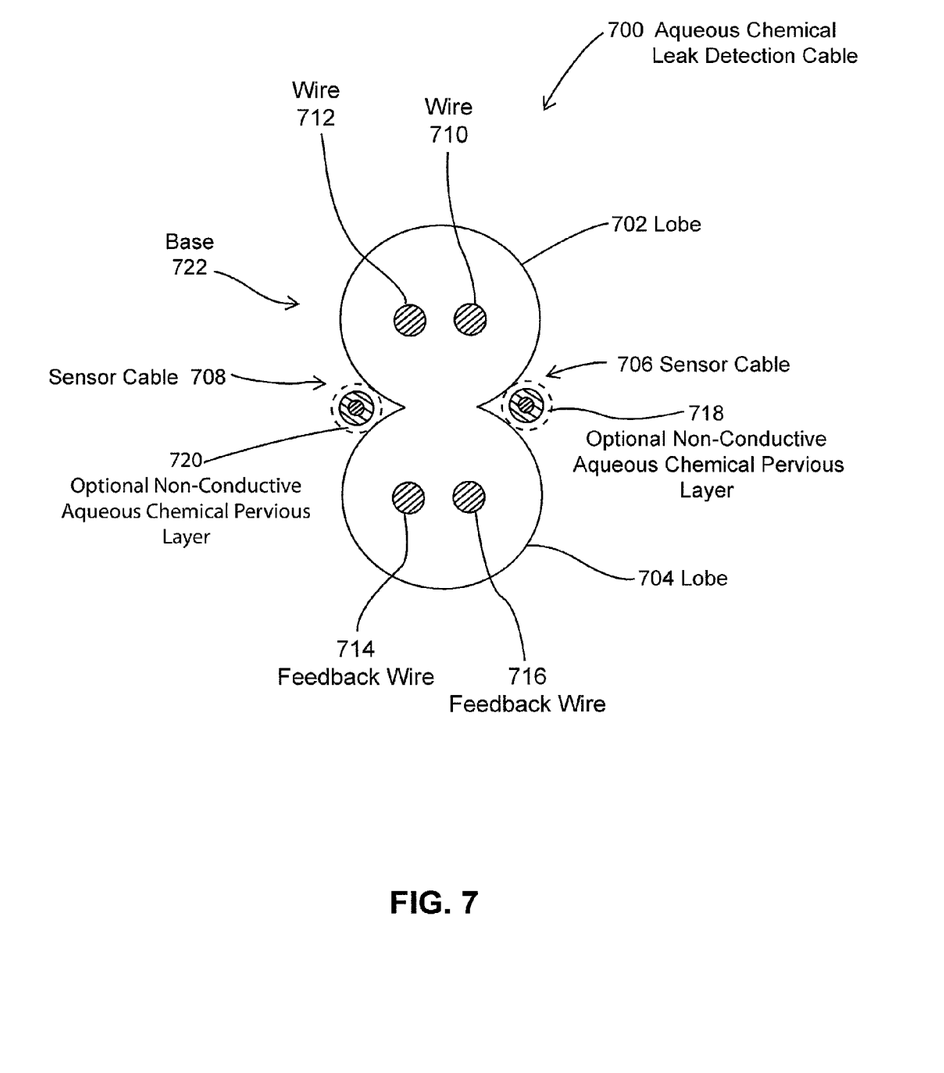
FIG. 7 is an end view of another embodiment of an aqueous chemical leak detection cable.

FIG. 7 is a schematic end view of another embodiment of a aqueous chemical leak detection cable 700. As shown in FIG. 7, the aqueous chemical leak detection cable 700 includes lobes 702, 704 that form a base 722. The aqueous chemical leak detection cable 700 also includes sensor cables 706, 708, that may or may not include optional, non-conductive, aqueous chemical pervious layers 718, 720. Inside lobe 702 are two wires, 710, 712, while lobe 704 includes feedback wires 714, 716. The two feedback wires 714, 716 are used to assist in completing the circuit for the monitoring of leaks, while the other two wires may be used for communication, power, and/or other purposes.

Figure 8:
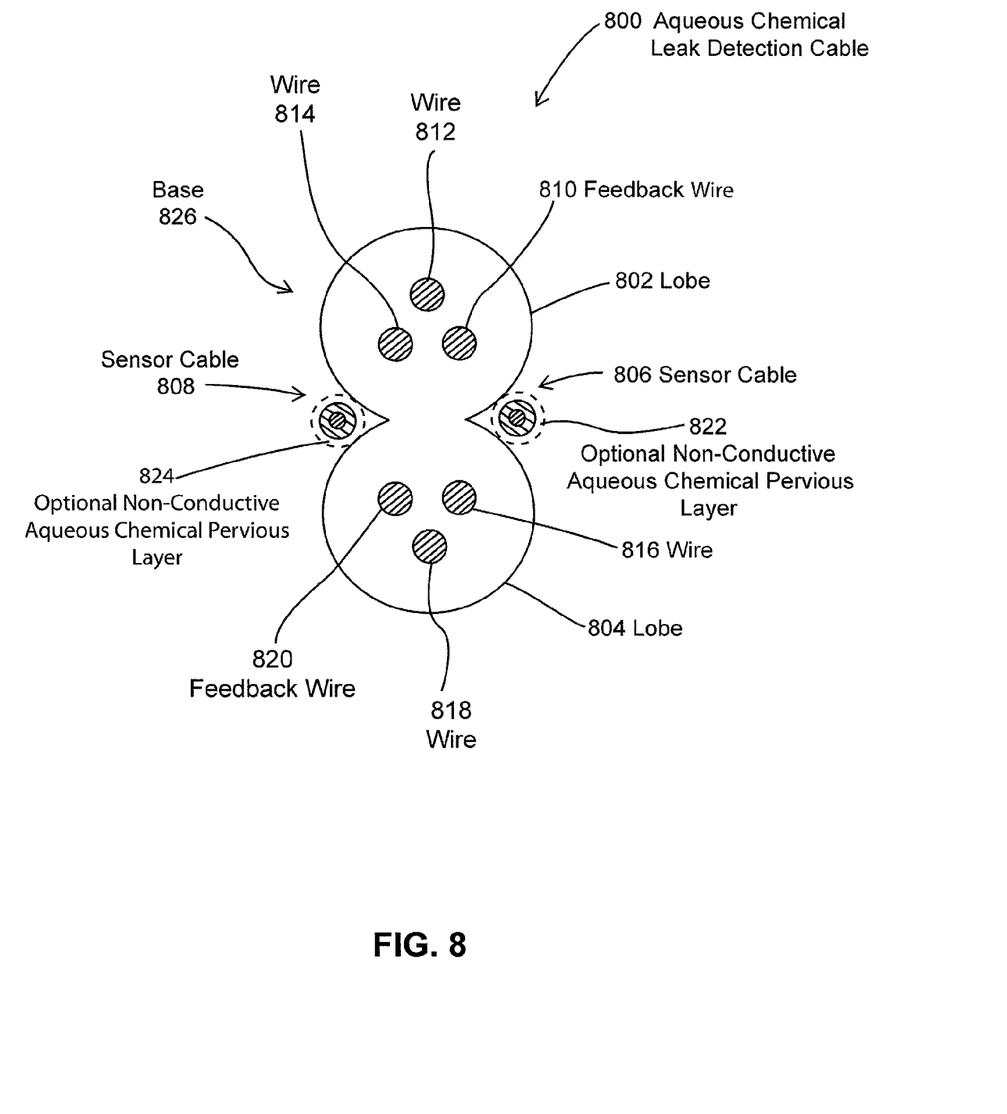
FIG. 8 is an end view of another embodiment of an aqueous chemical leak detection

FIG. 8 is a schematic end view of another embodiment of an aqueous chemical leak detection cable 800. As shown in FIG. 8, base 826 includes lobes 802, 804. The aqueous chemical leak detection cable 800 also includes sensor cables 806, 808 that may or may not have optional, non-conductive, aqueous chemical pervious layers 822, 824. In that regard, either one or both, or neither, of the sensor cables 806, 808, may include a non-conductive, aqueous chemical pervious layer. In addition, the non-conductive, aqueous chemical pervious layer may comprise either the braided fibers or the porous, continuous covering. As also shown in FIG. 8, lobe 802 includes feedback wires 810, 812, 814. Similarly, lobe 804 includes wires 816, 818, 820. One or two of these wires may be used in communicating leak detection information, while the other wires may be used for communication and/or power, etc.

Hence, the various embodiments of the aqueous chemical leak detection cable disclose a cable that is capable of detecting aqueous chemical leaks, which uses a conductive polymer coating that surrounds sensor wires, and that are resistant to corrosion by aqueous chemicals and protects the sensor wires. In addition, a base portion includes feedback wires for communicating information to a monitoring system. Additional wires can be disposed in the lobes that can be used for communicating data and/or providing power. Non-conductive layers that are pervious to aqueous chemicals can also be used on one or both of the sensor cables to assist in preventing false detection of aqueous chemical leaks resulting from contaminants, especially solid contaminants. Braided, non-conductive fibers that are non-hydroscopic can be used for the non-conductive, liquid pervious layer. These braided fibers dry quickly because the non-hydroscopic properties. In addition, a continuous coating can be used of a continuous, non-conductive porous polymer that is pervious to aqueous chemical liquids. Both the braided fibers and the continuous, non-conductive porous polymer may be constructed of materials that have affinity to the materials of the base from which the insulative material of the lobes are formed. In this manner, the affinity between the materials helps to maintain the sensor cables in the interstices between the lobes. In addition, in the embodiments in which an optional, non-conductive, aqueous chemical pervious coating is not used, a conductive polymer material may be used that has affinity to the insulative material of the base, so that the sensor cables are maintained within the interstices between the lobes of the base.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of sensing aqueous chemicals using an aqueous chemical leak detection cable comprising:
    obtaining an aqueous chemical leak detection cable comprising:
        a base member that is made from a non-conductive polymer that is resistant to corrosion by said aqueous chemicals, said base member formed from two insulated lobes that are joined together to form two interstices on opposite sides of said insulated lobes;
        at least one conductor wire in at least one lobe of said base member;
        sensor cables that have a conductive polymer coating that is resistant to corrosion by said aqueous chemicals that are disposed in said interstices; a non-conductive, aqueous chemical pervious layer surrounding at least one of said sensor cables that assists in preventing false readings from non-liquid contaminants;
a sensor wire in each of said sensor cables that is protected from said aqueous chemicals by said conductive polymer coating that is resistant to corrosion by said aqueous chemicals;
wherein said base member is twisted so that said sensor cables are exposed to a surface along a length of said aqueous chemical leak detection cable;
using said aqueous chemical leak detection cable to detect the presence of said aqueous chemicals on said surface whenever said aqueous chemicals create a conductive path between said sensor cables such that said conductive polymer coating creates said conductive path to said sensor wires from said aqueous chemicals and simultaneously protects said sensor wires from corrosion.

2. The method of claim 1 wherein said process of obtaining an aqueous chemical leak detection cable further comprises:
obtaining an aqueous chemical leak detection cable having at least one conductive wire in each of said two insulated lobes.

3. The method of claim 1 wherein said process of obtaining an aqueous chemical leak detection cable further comprises:
obtaining an aqueous chemical leak detection cable having more than one conductive wire in each of said two insulated lobes.

4. The method of claim 1 wherein said process of obtaining an aqueous chemical leak detection cable having a non-conductive, aqueous chemical pervious layer surrounding at least one of said sensor cables comprises:
obtaining an aqueous chemical leak detection cable having braided, non-conductive, non-hydroscopic fibers surrounding an outer surface of at least one of said sensors that allow aqueous chemical liquids to pass through openings between said fibers while substantially preventing non-liquid substances from contacting said conductive polymer coating on said sensor cables.

5. The method of claim 1 wherein said process of obtaining an aqueous chemical leak detection cable having a non-conductive, aqueous chemical pervious layer surrounding an outer surface of at least one of said sensor cables comprises:
obtaining an aqueous chemical leak detection cable having a continuous, non-braided, non-conductive, porous coating that surrounds an outer surface of said conductive polymer coating of at least one of said sensor cables and that is resistant to corrosion by said aqueous chemicals, and that allows aqueous chemical liquids to pass through openings in said porous coating while preventing non-liquid substances from contacting said conductive polymer coating on said sensor cables.

6. The method of claim 4 wherein said process of obtaining an aqueous chemical leak detection cable having braided, non-conductive, non-hydroscopic fibers comprises obtaining an aqueous chemical leak detection cable having braided, non-conductive, non-hydroscopic fibers of poly-meta-phenylene isophthalamide.

7. An aqueous chemical leak detection cable for detecting the presence of aqueous chemicals comprising:
a base member that is made from a non-conductive polymer that is resistant to corrosion by said aqueous chemicals, said base member comprising two lobes that are connected along a longitudinal surface to form two interstices on opposite sides of said base member;
at least one conductive wire disposed in at least one of said lobes of said base member;
two sensor cables that are disposed in said two interstices, said sensor cables having sensor wires and a conductive polymer coating that is resistant to corrosion by said aqueous chemicals and that surrounds said sensor wires to protect said sensor wires from corrosion by said aqueous chemicals, said two sensor cables and said base member being twisted together to form a helix so that said sensor cables are exposed in different directions along a length of said aqueous chemical leak detection cable, a non-conductive, aqueous chemical pervious layer surrounding at least one of said sensor cables of said two sensor cables that assists in preventing false readings from non-liquid contaminants.

8. The aqueous chemical leak detection cable of claim 7 further comprising:
at least one conductive wire disposed in each of said lobes of said base member.

9. The aqueous chemical leak detection cable of claim 7 wherein said non-conductive, liquid pervious layer surrounding said at least one sensor cable of said two sensor cables comprises:
braided, non-conductive, non-hydroscopic fibers that surround an outer surface of said at least one sensor cable that allow aqueous chemical liquids to pass through spaces between said fibers while preventing non-liquid substances from contacting said conductive polymer coating on said at least one sensor cable.

10. The aqueous chemical leak detection cable of claim 7 wherein said non-conductive, aqueous chemical pervious coating surrounding said at least one sensor cable comprises:
a continuous, non-braided, non-conductive, porous coating that surrounds an outer surface of said conductive polymer coating of at least one of said sensor cables, and that is resistant to corrosion by said aqueous chemicals, and that allows aqueous chemical liquids to pass through pores in said porous coating to contact said conductive polymer coating, while preventing non-liquid substances from contacting said conductive polymer coating on said at least one sensor cable.

11. The aqueous chemical leak detection cable of claim 9 wherein said fibers comprise an aromatic nylon.

12. The aqueous chemical leak detection cable of claim 9 wherein said fibers comprise poly-meta-phenylene isophthalamide.

13. The aqueous chemical leak detection cable of claim 9 wherein said fibers comprise a para-aramid synthetic fiber.

* * * * *